United States Patent
Akaike et al.

(10) Patent No.: US 6,317,647 B1
(45) Date of Patent: Nov. 13, 2001

(54) ALIGNER

(75) Inventors: Yutaka Akaike, Nishiyatsushiro-gun; Isao Kono, Higashiyamanashi-gun; Satoshi Sano, Yamanashi, all of (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/462,041

(22) PCT Filed: May 19, 1999

(86) PCT No.: PCT/JP99/02615

§ 371 Date: Dec. 29, 1999

§ 102(e) Date: Dec. 29, 1999

(87) PCT Pub. No.: WO99/60623

PCT Pub. Date: Nov. 25, 1999

(30) Foreign Application Priority Data

May 20, 1998 (JP) .................................................. 10-156691

(51) Int. Cl.⁷ ....................................................... G06F 7/00
(52) U.S. Cl. .......................................... 700/213; 324/765
(58) Field of Search .................................... 700/213, 215, 700/218, 226, 228, 229; 324/765, 758; 438/14; 414/935, 936, 939

(56) References Cited

U.S. PATENT DOCUMENTS

| | | | |
|---|---|---|---|
| 4,899,921 | * 2/1990 | Bendat et al. | 228/105 |
| 5,479,108 | * 12/1995 | Cheng | 324/765 |
| 5,976,260 | * 11/1999 | Kinoshita et al. | 118/719 |
| 6,084,215 | * 7/2000 | Furuya et al. | 219/444.1 |
| 6,124,725 | * 9/2000 | Sato | 324/765 |
| 6,205,652 | * 3/2001 | Yonezawa et al. | 29/743 |
| 6,211,960 | * 4/2001 | Hembree | 356/400 |

* cited by examiner

Primary Examiner—Christopher P. Ellis
Assistant Examiner—Khoi H. Tran
(74) Attorney, Agent, or Firm—Morrison & Foerster LLP (57) ABSTRACT

An aligner (10) according to the present invention is an apparatus in which a wafer chuck (50), wafer (W), and contactor (60) are aligned with one another, and these three elements are then united to form a shell (S), and the shell (S) is reduced to the three elements. A identification code (62) is attached to the contactor (60). A reader (41) reads the identification code (62). The identification code (62) read by means of the reader (41) is associated with the position of the main chuck (15) reached when first and second valve mechanisms (51, 52) are connected, and is loaded into a control device (40). When the shell (S) is disassembled, the position of the main chuck (15) is retrieved in the control device (40) in accordance with the identification code (62) read by means of the reader (41). The main chuck (15) is moved according to the result of the retrieval.

10 Claims, 4 Drawing Sheets

ALIGNER

TECHNICAL FIELD

The present invention relates to an aligner.

More specifically, the invention relates to an aligner applicable to the case of collective inspection of a large number of semiconductor devices (hereinafter referred to as "IC chips") formed on a semiconductor wafer (hereinafter referred to as "wafer").

An aligner is a technique for forming a test shell including a contactor, wafer, and wafer holder (hereinafter referred to as "wafer chuck") that are united by means of a vacuum sucking force. The contactor is electrical contact means that comprises contact terminals capable of collectively electrically touching a plurality of electrodes of a plurality of IC chips on the wafer and external terminals connected individually to the contact terminals.

BACKGROUND ART

In a semiconductor inspection process, a large number of IC chips formed on a wafer are checked for electrical properties, and those chips which have no defects in electrical properties are screened. The screened non-defective chips are packaged by means of a synthetic resin or ceramic material in an assembly process. In a reliability test, moreover, the packaged products are subjected to temperature stress and electrical stress to detect potential defects and the like in the chips, whereby defective ones can be removed.

With the development of smaller-sized, higher-function electrical products, on the other hand, chips have been reduced in size and enhanced in integration. Recently, various mounting techniques have been developed further to miniaturize semiconductor products. In particular, there have been developed techniques for mounting unpackaged chips or so-called bare chips. The bare chips require quality assurance when they are brought to market. In order to obtain guaranteed bare chips, the individual IC chips must be checked for reliability.

In inspecting bare chips by means of a conventional reliability tester, it is necessary to solve various problems including electrical connections between the bare chips and sockets. Besides, handling the small bare chips is very difficult and possibly entails an increase in inspection cost.

Accordingly, techniques for reliability tests have been proposed in Jpn. Pat. Appln. KOKAI Publications Nos. 7-231019, 8-5666 and 8-340030, for example. According to these techniques, a plurality of wafers can be collectively subjected entire to the tests with IC chips formed thereon.

Conventionally, however, a contactor is opposed to each wafer, contact terminals of the contactor are visually aligned with a plurality of electrodes of a plurality of IC chips formed on the wafer (hereinafter referred to as "alignment"), and the terminals and the electrodes are collectively brought into contact with one another. In carrying out this operation, an operator's operation for alignment between a reference contact terminal and its corresponding electrode pad takes a lot of time. Thus, the operating efficiency is poor, the operator is heavily burdened, and a stable contact state cannot be obtained with ease due to personal errors in alignment accuracy.

In Jpn. Pat. Appln. No. 10-54423, therefore, the applicant hereof proposed a technique (aligner) for forming a unit (hereinafter referred to as "test shell") by translating a stage, carrying thereon a wafer chuck holding a wafer, in X, Y and θ directions with respect to a contactor, thereby aligning the wafer and the contactor, moving the stage in a Z direction thereafter, and collectively bringing the three elements, i.e., the contactor, wafer, and wafer holder, into contact with one another by means of a vacuum sucking force that is formed by a vacuum suction mechanism attached to the wafer holder.

This aligner can be also used for the case where the test shell is disassembled or reduced to the aforesaid three elements after testing. During this disassembly, the test shell is transferred from a test chamber to a predetermined position in an alignment chamber. This predetermined position is the same position where the test shell is formed. In disassembling the test shell to the aforesaid three elements, therefore, it is necessary to move the stage accurately to the position where the test shell is formed. By doing this, the test shell and the stage are aligned with each other, whereupon an air charging-exhaust device (valve control mechanism) that is mounted on the stage is connected to a valve mechanism of the vacuum suction mechanism of the wafer chuck. As the valve control mechanism operates the valve mechanism of the wafer chuck, the vacuum sucking force of the wafer chuck is canceled, whereupon the shell is allowed to be disassembled or reduced to the three elements.

Actually, however, the stage cannot always be located in a predetermined position with respect to the test shell that is carried into the alignment chamber after testing. In this case, it is hard accurately to align a valve control mechanism attached to a main chuck with a valve mechanism of the tested shell on the aligner.

DISCLOSURE OF THE INVENTION

An object of the present invention is to solve the problems described above.

Another object of the present invention is to provide an aligner in which a test shell can be securely placed on a stage by securely locating the stage in the position in which the shell is integrated, without regard to the position of a wafer on a wafer holder, when the shell, which is obtained by uniting a contactor, the wafer, and the wafer holder, is disassembled.

According to a first aspect of the present invention, there is provided an aligner for forming and disassembling a test shell, comprising: a contactor including a plurality of contact terminals electrically in contact with a plurality of electrodes of a plurality of semiconductor devices formed on a semiconductor wafer; a wafer holder provided with a vacuum suction mechanism including a valve mechanism and capable of holding the contactor and the semiconductor wafer by means of a vacuum sucking force formed by the vacuum suction mechanism, thereby forming an integral test shell; a stage for supporting the wafer holder for movement in X, Y, Z and θ directions; a first control device for effecting control for moving the stage in the X, Y and θ directions so that the plurality of contact terminals and the plurality of predetermined electrodes are aligned with one another and controls for moving the stage in the Z direction so that the contact terminals and the electrodes are in contact with one another; a valve control mechanism mounted on the stage and used to connect and disconnect the valve mechanism of the wafer holder to and from an exhaust device, the valve control mechanism serving to connect the vacuum suction mechanism of the wafer holder to the exhaust device, cause the vacuum suction mechanism to form the vacuum sucking force, and cancel the vacuum sucking force of the vacuum suction mechanism of the wafer holder, thereby reducing the test shell to the wafer holder, the semiconductor wafer, and the contactor; a storage unit for storing position information on the position in which the stage is moved in the X, Y and θ directions to align the plurality of contact terminals and the plurality of electrodes with one another; and a second control device adapted to move the stage to the position in accordance with the position information stored in the storage unit and place the test shell on the stage in the position, thereby canceling the vacuum sucking force, as the vacuum sucking force is canceled by means of the valve mechanism to disassemble the test shell.

Preferably, in this aligner, the test shell is a shell for one test, out of a reliability test and an electrical property test.

Preferably, this aligner comprises a reader for reading an identification code provided outside the wafer holder and/or the contactor, and in this aligner, the storage unit also stores the identification code, and the second control device moves the stage to the position in accordance with the identification code and the position information.

Preferably, in this aligner, the identification code is a bar code, and the reader is a bar code reader.

Preferably, in this aligner, the identification code is automatically readable information.

Preferably, the automatically readable information is selected among optically readable information, magnetically readable information, and mechanically readable information.

Preferably, in this aligner, the storage unit also stores information on the distance for which the stage is raised in the Z direction to bring the plurality of predetermined electrodes of the semiconductor wafer electrically into contact with the plurality of contact terminals of the contactor.

According to a second aspect of the present invention, there is provided a method for disassembling the test shell in the aforesaid aligner, comprising steps of: moving the stage to the position for the formation of the test shell in accordance with the position information stored in the storage unit; placing the test shell on the moved stage; connecting the valve control mechanism on the stage to the valve mechanism of the wafer holder of the test shell; and canceling the vacuum sucking force of the vacuum suction mechanism of the test shell by means of the valve control mechanism.

Preferably, this method further comprises a step of reading an identification code provided outside the wafer holder and/or the contactor and loading the identification code into the storage unit, and in this method, the step of moving the stage to the position for the formation of the test shell is carried out in accordance with the position information and the identification code.

According to a third aspect of the present invention, there is provided a shell used in the aforesaid aligner, wherein the wafer holder holding the semiconductor wafer and the contactor including a plurality of contact terminals electrically in contact with a plurality of electrodes of a plurality of semiconductor devices formed on the semiconductor wafer are united by means of the vacuum sucking force in a manner such that the plurality of contact terminals are electrically in contact with the plurality of predetermined electrodes, and a readable identification code is attached to the outer surface of the wafer holder and/or the contactor.

BRIEF DESCRIPTION OF DRAWINGS

The drawings illustrate a preferred embodiment of the present invention. The drawings are conducive to a description of the present invention, based on the above general description and the following detailed description of the embodiment.

BEST MODE OF CARRYING OUT THE INVENTION

The present invention relates to an aligner that is applied to the case of collective inspection of a large number of semiconductor devices formed on a semiconductor wafer. This inspection includes various tests on the semiconductor devices, such as a reliability test, electrical property test, etc. The following is a description of an embodiment in which the aligner of the present invention is used in a reliability test.

Figure 1:
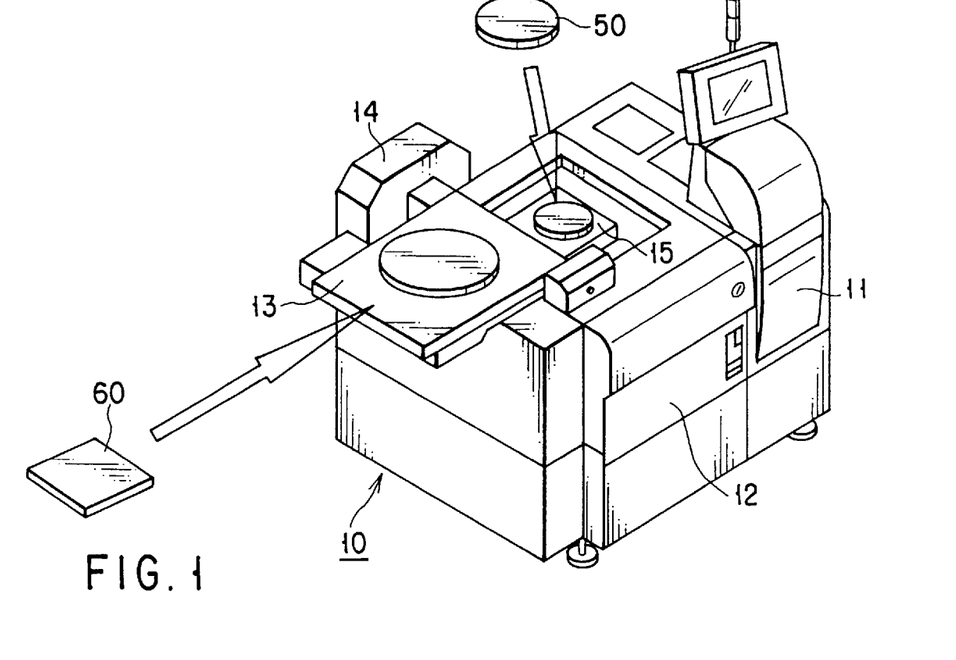
FIG. 1 is a perspective view showing an external appearance of one embodiment of an aligner according to the present invention.

The present invention will be described according to the embodiment shown in FIGS. 1 to 6. As shown in FIG. 1, for example, an aligner 10 of the present embodiment comprises a loader chamber 11, which stores wafers W in carriers and serves to load and unload each wafer W (see FIG. 2), and an alignment chamber 12, which adjoins the loader chamber 11 across a partition wall and in which a contactor 60 and a wafer W held by means of a wafer chuck 50 are aligned and then brought into contact with each other to be united. A transportation mechanism (fork) and a pre-alignment mechanism (sub-chuck), neither of which is shown, are arranged in the loader chamber 11. The fork can transport the wafers W one by one from each carrier. In the process of transportation, each wafer W is pre-aligned on the sub-chuck with its orientation flat used as a reference. Thereafter, each wafer W is transported into the alignment chamber 12 by the fork.

Figure 2:
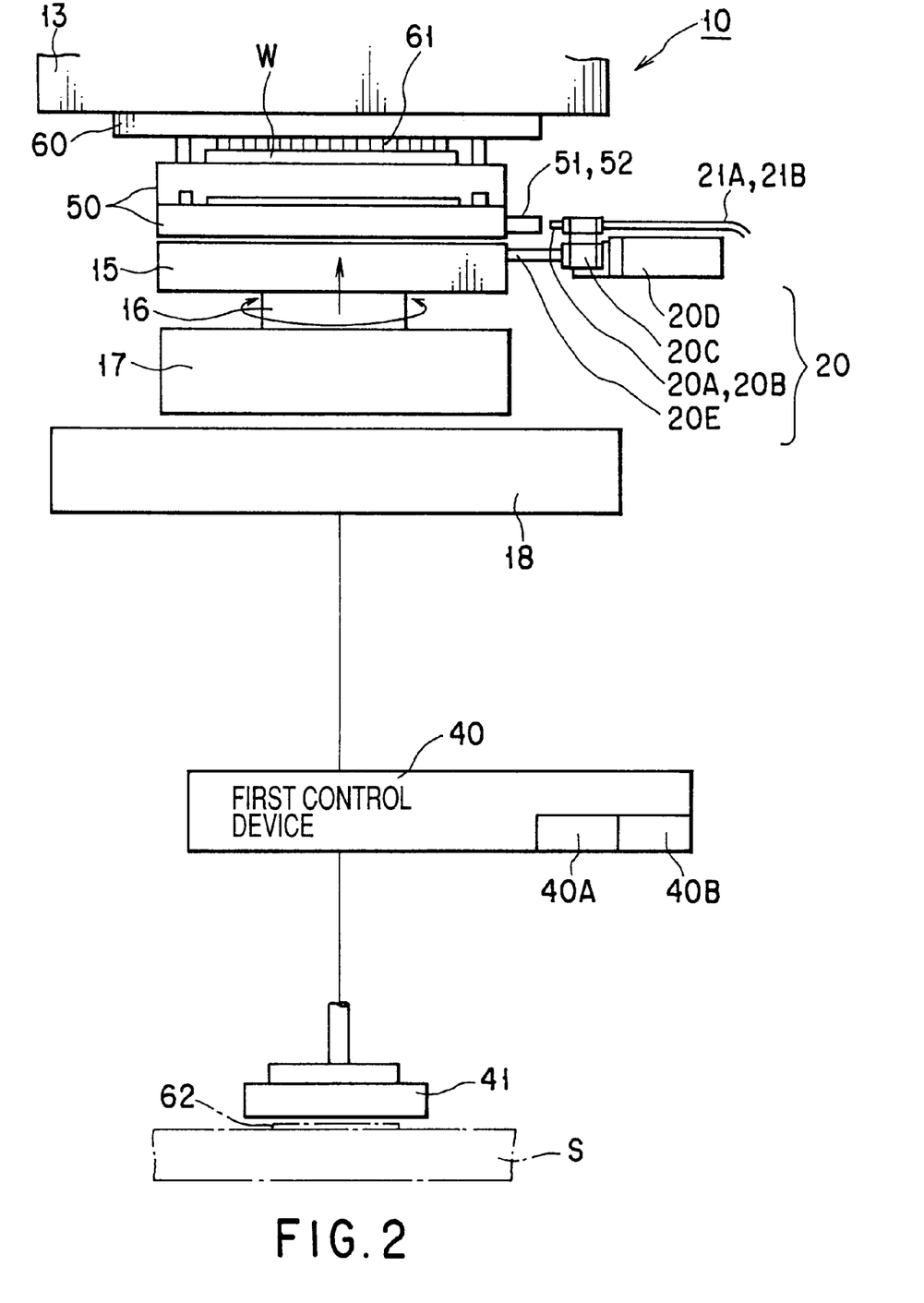
FIG. 2 is a side view showing a wafer chuck, wafer, and contactor brought collectively into contact with one another by means of the aligner shown in FIG. 1.

As shown in FIG. 1, a head plate 13 is attached to the alignment chamber 12 for open-close operation. The contactor 60 is mounted on the head plate 13. The head plate 13 can be moved at a top opening portion of the alignment chamber 12 by means of an open-close drive mechanism 14. In the alignment chamber 12, a stage (main chuck) 15 is located under the head plate 13 so as to be movable in directions X, Y, Z and θ. The wafer chuck 50 is placed on the stage 15. As shown in FIG. 2, the main chuck 15 can be moved up and down in the direction Z and rotated forwardly and reversely in the direction θ over an X-stage 17 by means of a rotary lift mechanism 16. The x-stage 17 is supported over the Y-stage 18 for reciprocation in the direction X. The Y-stage 18 is supported over a base (not shown) for reciprocation in the direction Y. The wafer W pre-aligned by means of the fork in the loader chamber 11 is placed on the wafer chuck 50 on the main chuck 15 in the alignment chamber 12.

An alignment mechanism (not shown) is provided in the alignment chamber 12. This alignment mechanism can be provided with an upper camera fixed to an alignment bridge and a lower camera fixed on the side of the main chuck 15. Images of inspection electrode pads of the wafer W held by the wafer chuck 50 are picked up by means of the upper camera. After the main chuck 15 is moved, the lower camera is used to pick up images of contact terminals (e.g., bump terminals) 61 of the contactor 60 that is fixed to the head plate 13. The wafer W and the contactor 60 are aligned with each other in accordance with these image data. The technique proposed in Jpn. Pat. Appln. No. 10-54423 can be employed as an example of this alignment mechanism.

After the wafer W is aligned in the alignment chamber 12, the main chuck 15 carrying the wafer W thereon is lifted by the rotary lift mechanism 16, and the inspection electrode pads of the wafer W and the bump terminals 61 of the contactor 60 are brought collectively into contact with one another, as shown in FIG. 2. In this state, the wafer W and the contactor 60 are attracted to the wafer chuck 50 by vacuum sucking force so that these three are united, whereupon a test shell S is formed, as mentioned later.

To attain this unification, the component devices in the loader chamber 11 and the alignment chamber 12 are driven under the control of a first control device 40, as shown in FIG. 2.

The wafer chuck 50 and the contactor 60 are provided with an identification code (e.g., bar code or character information) 62 that can be read by a reader. Each contactor 60 can be discriminated from other contactors by this identification code 62. The control device 40 is connected with a reader (e.g., bar code reader or optical character reader) 41 for reading the identification code. Each contactor 60 is specified by the identification code 62 that is read by means of the reader 41.

Further, position information (position coordinate data for the directions X, Y and θ and position coordinate data for the direction Z) on the main chuck 15 obtained when the test shell S is assembled in the aforesaid manner in the alignment chamber 12 are loaded into a storage section through a central processing unit of the control device 40. This position information and the identification code 62 for specifying the contactor 60 are made to correspond to each other by means of the central processing unit 40A, and are collectively loaded as relevant information into a storage section (storage unit) 40B.

Figure 3:
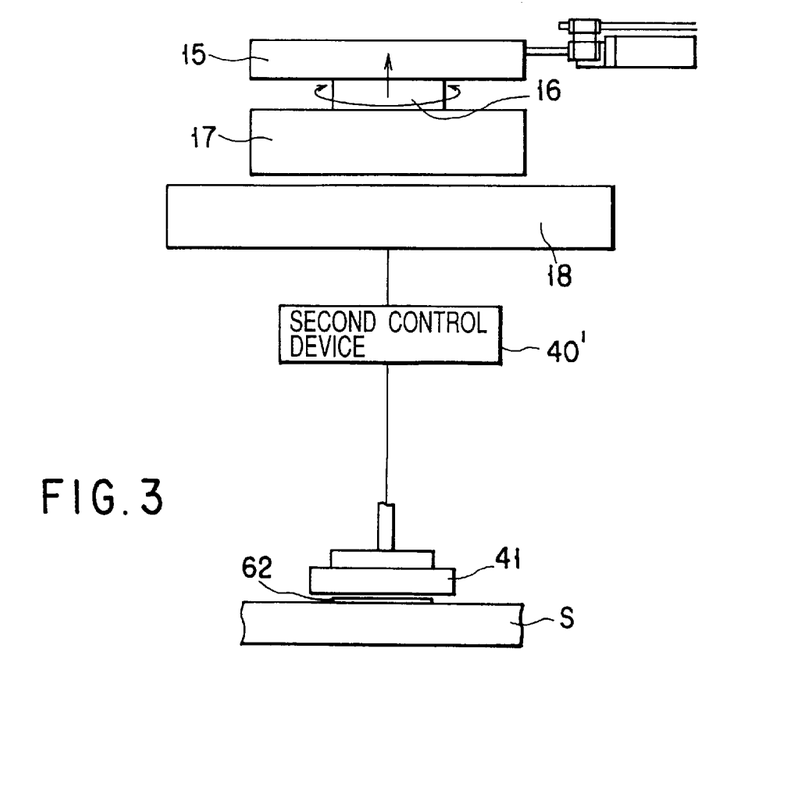
FIG. 3 shows the way of reading an identification code on a shell as the aligner shown in FIG. 1 is disassembled.
Figure 5:
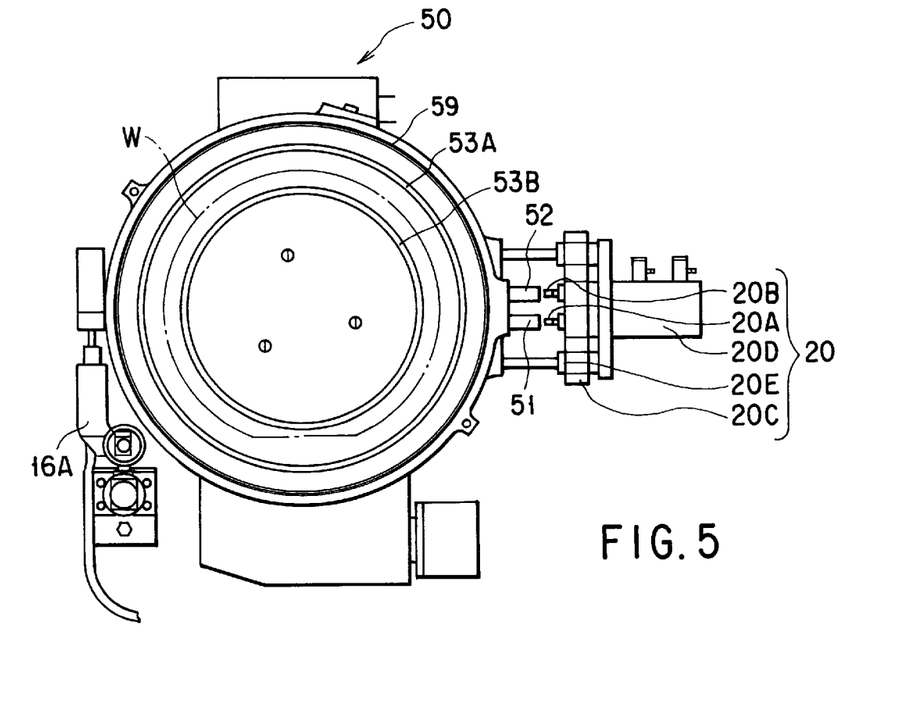
FIG. 5 is a plan view showing the wafer chuck integrated by means of the aligner shown in FIG. 1.

When the test shell S is disassembled, the identification code 62 of the test shell is read by the reader 41, as shown in FIG. 3. Position information corresponding to the identification code is retrieved by the central processing unit. Based on the result of this retrieval, the position information on the main chuck 15 is obtained in the central processing unit for the case where the shell S is formed as an integral structure. Based on this position information, a second control device drivingly controls the main chuck 15. The first control device 40 can double as this second control device 40'. As mentioned later, the main chuck 15 is moved to the position (X, Y, θ) for the case where the wafer chuck 50, wafer W, and contactor 60 are united in the form of the test shell S. The main chuck 15 receives the test shell S in this position, and valve mechanisms 51 and 52 of the test shell S and a valve control mechanism 20 of the main chuck 15 are accurately aligned and connected to one another (FIG. 5). By this connection, the vacuum sucking force of the test shell S is canceled, whereupon the test shell S can be disassembled or reduced to the aforesaid three elements.

Figure 4:
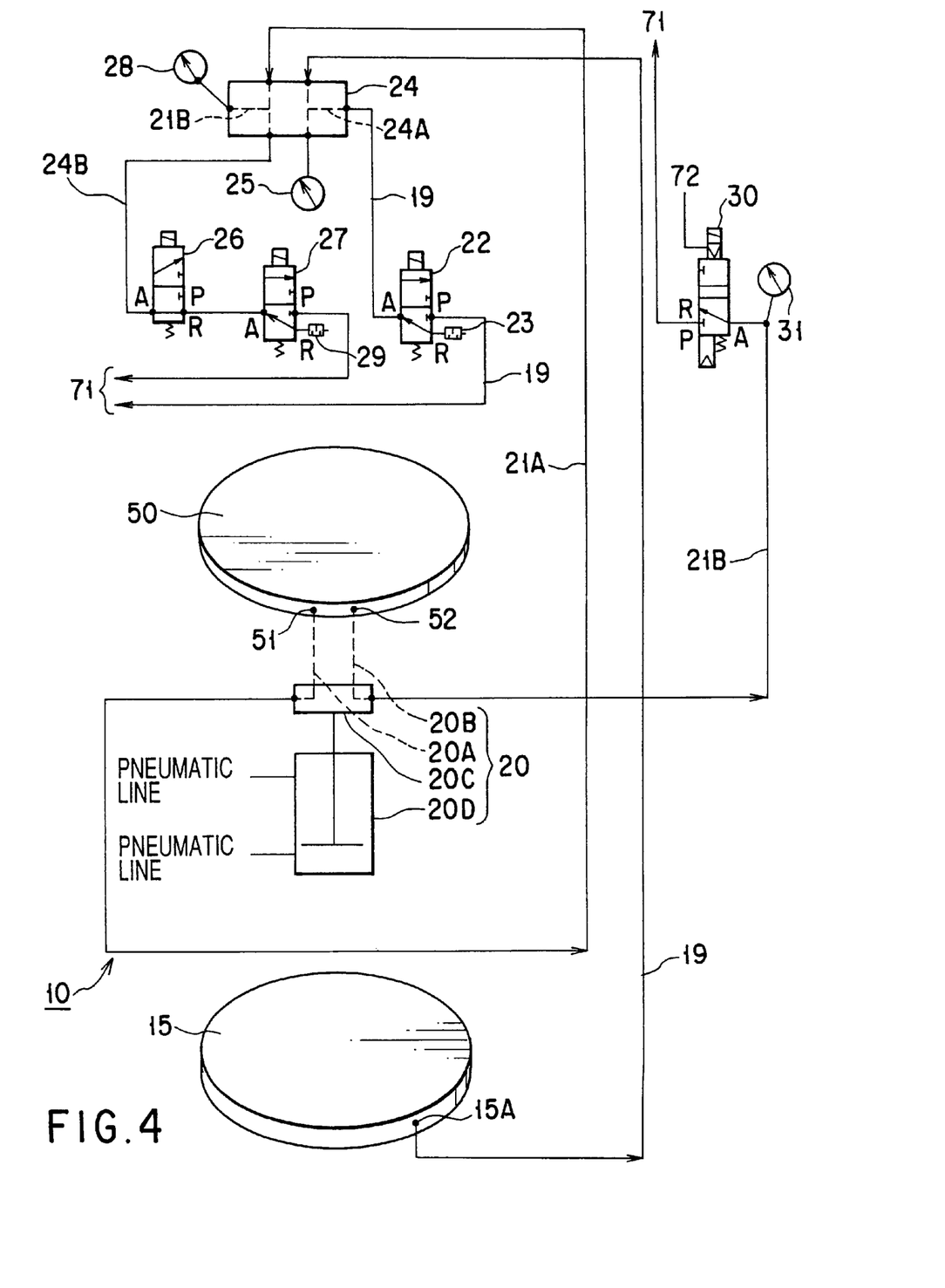
FIG. 4 is a circuit diagram showing a vacuum exhaust system of the aligner shown in FIG. 1.
Figure 6A:
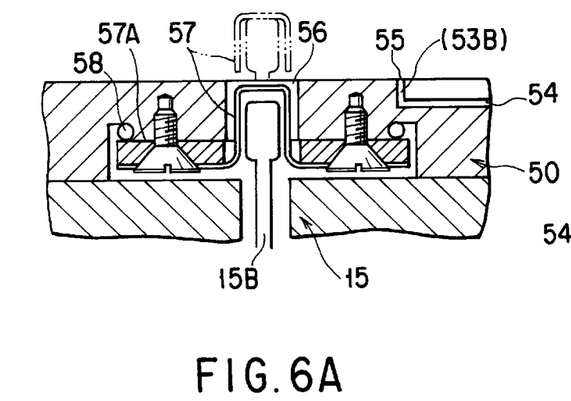
FIG. 6A is a view showing the relation between the wafer chuck shown in FIG. 5 and three pins of a main chuck.
Figure 6B:
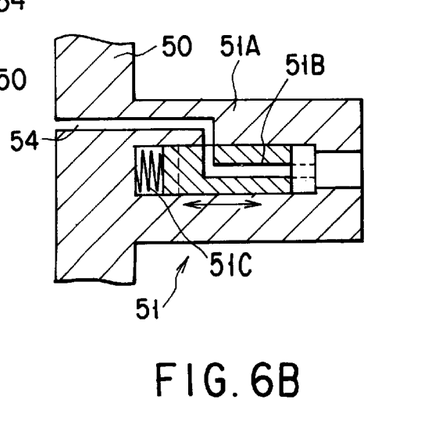
FIG. 6B is a view showing a first valve mechanism of the wafer chuck.

Referring to FIGS. 4 to 6, there will be described a technique for uniting the aforesaid three elements by means of the vacuum sucking force and a technique for disassembling them. An internal channel 54 (FIG. 6B) is formed inside the wafer chuck 50. The internal channel 54 includes a plurality of apertures in grooves on the surface of the wafer chuck 50 and air inlet and outlet ports 54 in its outer peripheral surface, as shown in FIGS. 4 and 6B. The air inlet and outlet ports 54 are connected to an exhaust device 71 via the valve control mechanism 20 and vacuum exhaust lines 21A and 21B, as shown in FIGS. 4 and 5. This internal channel is evacuated by means of the exhaust device 71, whereupon a vacuum sucking force is formed in the grooves 53A and 53B (FIG. 5) on the surface of the wafer chuck 50. Thus, the valve control mechanism 20, internal channel, and grooves 53A and 53B constitute a vacuum suction mechanism. By this vacuum sucking force, the wafer W and the contactor that are placed on the wafer chuck 50 are subjected to vacuum suction, whereupon these three elements are united to form the test shell.

Grooves to be formed on the top surface of the wafer chuck 50, as shown in FIG. 4, may be the two grooves 53A and 53B, as shown in FIG. 5. Each of the two grooves 53A and 53B is provided with an opening of the internal channel. The air inlet and outlet ports can be fitted with the first and second valve mechanisms 51 and 52 of the same type, respectively.

As shown in FIGS. 2 and 5, the valve control mechanism 20 is attached to the outer peripheral surface of the wafer chuck 50. The first and second valve mechanisms 51 and 52 are opened or closed by means of the valve control mechanism 20. More specifically, the valve control mechanism 20 is provided with first and second quick couplings 20A and 20B corresponding to the first and second valve mechanisms 51 and 52, respectively, a body 20C having an internal channel connected with the first and second quick couplings 20A and 20B, an air cylinder 20D having a piston rod for moving the body 20C, and a pair of guide rods 20E for guiding the body 20C in its moving direction, as shown in FIGS. 2 and 5. The air cylinder 20D causes the first and second quick couplings 20A and 20B to advance and plunge into the first and second valve mechanisms 51 and 52, respectively, thereby opening valves in the valve mechanisms 51 and 52.

When the first and second quick couplings 20A and 20B retreat, the respective valves of the first and second valve mechanisms 51 and 52 are retreated by the repulsive force of a spring 51C, so that the internal channel is closed automatically.

The vacuum exhaust lines 21A and 21B are connected to the first and second quick couplings 20A and 20B, respectively, of the valve control mechanism 20. The internal channel of the wafer chuck 50 is evacuated through the individual vacuum exhaust lines 21A and 21B, whereupon the wafer W and the contactor 60 are attracted to the wafer chuck 50 by vacuum suction.

The vacuum exhaust line 21A is connected to an internal channel for attracting the contactor 60 by vacuum suction, while the vacuum exhaust line 21B is connected to an internal channel for attracting the wafer W by vacuum suction.

As shown in FIG. 4, a vacuum exhaust line 19 of the main chuck 15 is provided with a solenoid valve 22 of the three-port type for use as a selector valve. When the solenoid valve 22 is energized, the main chuck 15 is connected to the side of a vacuum exhaust device (not shown) or the P-port side, so that the wafer chuck 50 is attracted to the main chuck 15 by vacuum suction.

When the solenoid valve 22 is not energized, as shown in FIG. 4, the main chuck 15 on the vacuum exhaust device side is connected to the R-port side (the side of a silencer 23) by means of the solenoid valve 22, and the main chuck 15 is exposed to the atmosphere through the silencer 23. Thus, the vacuum sucking force is canceled, so that the wafer chuck 50 can be transported from the region over the main chuck 15.

A channel 24A on the side of the vacuum exhaust line 19 is fitted with a pressure gauge 25 for measuring the degree of vacuum of its vacuum system. The pressure gauge 25 measures the degree of vacuum of the vacuum system that ranges from the internal channel of the main chuck 15 to the solenoid valve 22. Based on this measured valve, the presence of the vacuum sucking force of the main chuck 15 can be detected.

The vacuum exhaust line 21A of the wafer chuck 50 is provided with first and second solenoid valves 26 and 27 of the three-port type, the former being nearer to the wafer chuck 50 than the latter. A channel 24B on the side of the vacuum exhaust line 21A is fitted with a pressure gauge 28 for measuring the degree of vacuum of its vacuum system. The pressure gauge 28 measures the degree of vacuum of the vacuum system between the internal channel of the wafer chuck 50 (more specifically, the internal channel on the side where the wafer chuck is attracted by suction) and the first solenoid valve 26. Based on this measured valve, the degree of vacuum between the wafer chuck 50 and the contactor 60 is detected.

When neither of the first and second solenoid valves 26 and 27 is energized, as shown in FIG. 4, the wafer chuck 50 is connected to the side of a silencer 29 (R-port) by means of the first and second solenoid valves 26 and 27 and exposed to the atmosphere. In this state, air is introduced into the test shell S that incorporates the wafer chuck 50, wafer W, and contactor 60, whereupon these three elements can be separated from one another. When the second solenoid valve 27 is energized with the first solenoid valve 26 off, the wafer chuck 50 is connected to the side of the vacuum exhaust device (P-port) by means of the first and second solenoid valves 26 and 27, whereupon its internal channel is evacuated. In this state, the contactor 60 is attracted to the wafer chuck 50 by vacuum suction and subjected to operation for the unification as the shell S. When the first solenoid valve 26 is energized with the second solenoid valve 27 off, the first solenoid valve 26 is separated from the second solenoid valve 27 and cut off from the atmosphere. Further, the second solenoid valve 27 is separated from the vacuum exhaust device and exposed to the atmosphere through the silencer 29. In this state, the pressure gauge 28 detects the degree of vacuum in the evacuated test shell S, thereby checking the test shell for vacuum leakage. The P-port of the first solenoid valve 26 is sealed.

The vacuum exhaust line 21B of the wafer chuck 50 is provided with a solenoid valve 30 of the three-port type. When the solenoid valve 30 is energized, the wafer chuck 50 is connected to the side of the vacuum exhaust device 71, so that the wafer W is attracted to the wafer chuck 50 by vacuum suction. When the solenoid valve 30 is not energized, the wafer chuck 50 is separated from the side of the vacuum exhaust device 71, whereupon the internal channel of the wafer chuck 50 is connected to a pneumatic line 72 and exposed to the atmosphere, and the vacuum sucking force between the three elements is canceled. A pressure gauge 31 is mounted between the solenoid valve 30 and the wafer chuck 50. The pressure gauge 31 measures the degree of vacuum of the internal channel between the solenoid valve 30 and the wafer chuck 50 (more specifically, the internal channel on the side where the wafer is attracted by suction).

The wafer chuck 50 will further be described with reference to FIG. 5, FIG. 6A and FIG. 6B. As shown in FIG. 5, the ring-shaped grooves 53A and 53B are formed in the shape of concentric circles on the top surface of the wafer chuck 50. Openings 55 of the internal channel 54 are arranged in a plurality of positions in the ring-shaped grooves 53A and 53B. A seal ring 56, which is formed of an elastic member with high flexibility, such as silicone rubber, is mounted near the outer periphery of the top surface of the wafer chuck 50. When the wafer chuck 50 and the contactor 60 are united, the seal ring 56 serves to prevent vacuum leakage. Thus, when the wafer W and the contactor 60 are put on the wafer chuck 50 in the order named, and if the internal channel is evacuated through the vacuum exhaust lines 21A and 21B, as mentioned before, the aforesaid three elements are united. In FIG. 5, 16A denotes a θ drive mechanism that is used for alignment. The main chuck 15 is rotated forwardly and reversely in the direction θ by the θ drive mechanism 16A.

The valve mechanisms 51 and 52 are constructed in the manner shown in FIG. 6B, for example. Since the valve mechanisms 51 and 52 are of the same type, only the valve mechanism 51 will be described. The valve mechanism 51 includes a body 51A, a spool 51B capable of reciprocating in the body 51A, and the spring 51C that continually urges the spool 51B outward. If the first quick coupling 20A is inserted into the body 51A, the spool 51B is pushed in against the spring 51C, whereupon the channel is opened. If the first quick coupling 20A is disengaged, the spool 51B is restored to its original position by the urging force of the spring 51C, whereupon the channel is cut off again.

As shown in FIG. 6A, the wafer W is placed on the wafer chuck 50 or fetched with the aid of its three pins 15B. As shown in FIG. 6A, the wafer chuck 50 has through holes 56 for three pins, which are formed individually in three positions inside the ring-shaped grooves 53B. The outside diameter of each through hole 56 is larger than that of each of the three pins 15B. As shown in the same drawing, each through hole 56 is provided with a silicone rubber membrane 57 in the form of a cylinder with a closed distal end. The proximal end portion of the silicone rubber membrane 57 is screwed to a recessed portion on the backside of the wafer chuck 50 with the aid of, for example, an aluminum gasket 57A. An O-ring 58 is fitted on the outer periphery of the gasket 57A. The silicone rubber membrane 57 and the O-ring 58 serve to keep the wafer chuck 50 and the contactor 60 airtight, thereby maintaining a decompressed state between the elements 60 and 50. The respective distal ends of the three pins 15B are formed somewhat thick and round lest they damage the silicone rubber membrane 57. When the wafer is placed on the wafer chuck 50 on the main chuck 15 or fetched from the wafer chuck 50, the three pins 15B rise and plunge individually into the through holes 56 of the wafer chuck 50, and stretch the silicone rubber membranes 57 as they project from the top surface of the wafer chuck 50, as indicated by dashed line in the drawing. Although the three pins 15B move in this manner, the silicone rubber membranes 57 can maintain the decompressed state between the wafer chuck 50 and the contactor 60.

The following is a description of operation. The head plate 13 is taken off by means of the open-close drive mechanism 14. The contactor 60 is fitted on the head plate 13, and the wafer chuck 50 is placed on the main chuck 15. The wafer chuck 50 is placed on the main chuck 15 so as to fit the three pins of the main chuck 15. As this is done, the first and second valve mechanisms 51 and 52 of the wafer chuck 50 are positioned corresponding to the first and second quick couplings 20A and 20B, respectively.

After the head plate 13 is then put on by means of the open-close drive mechanism 14, the vacuum exhaust device is actuated. When the solenoid valve 22 on the vacuum exhaust line 19 of the main chuck 15 is energized, the main chuck 15 is connected to the vacuum exhaust device side by means of the solenoid valve 22. The internal channel of the main chuck 15 is evacuated, whereupon the wafer chuck 50 is attracted to the main chuck 15 by vacuum suction. When the air cylinder 20D of the valve control mechanism 20 is then actuated, the first and second quick couplings 20A and 20B are connected to the first and second valve mechanisms 51 and 52, respectively, of the wafer chuck 50.

The wafer W is pre-aligned by means of the fork and the sub-chuck in the loader chamber 11. The wafer W is placed on the wafer chuck 50 by means of the fork. When the solenoid valve 30 on the vacuum exhaust line 21B of the wafer chuck 50 is energized, the wafer chuck 50 is connected to the vacuum exhaust device side by means of the solenoid valve 30, and the internal channel of the wafer chuck 50 for wafer attraction is evacuated, whereupon the wafer W is attracted to the wafer chuck 50 by vacuum suction. At this time, the sucking force can be recognized by means of the pressure gauge 31. The evacuation is continued until the test shell S integrated at a given degree of vacuum is checked for vacuum leakage. When the wafer W is attracted to the wafer chuck 50 in this manner, the respective centers of the wafer W and the wafer chuck 50 or the main chuck 15 may not be coincident with each other in some cases. In this state, the X- and Y-stages 17 and 18 and the θ drive mechanism 16A are actuated, the alignment mechanism is actuated, and the electrode pads of the wafer W and the bump terminals 61 of the contactor 60 are aligned with one another. When the alignment is finished, the rotary lift mechanism 16 is actuated, whereupon the main chuck 15 rises so that the electrode pads of the wafer W and the bump terminals 61 come collectively into contact with one another, as shown in FIG. 2. At this time, the center position coordinates of the head plate 13 or the center position of the wafer W and the position coordinate data of the main chuck 15 (coordinates X, Y, Z and θ for the reference position coordinates of the main chuck) obtained when the test shell S is united are loaded into the storage section of the control device 40. These data are utilized in disassembling the test shell S.

When the second solenoid valve 27 on the vacuum exhaust line 21A of the wafer chuck 50 is energized in this state, the contactor-side internal channel of the wafer chuck 50 is connected to the vacuum exhaust device side. The contactor-side internal channel of the wafer chuck 50 is evacuated so that the contactor 60 is attracted to the wafer chuck 50 by vacuum suction. Thereupon, the two elements 60 and 50 are sealed airtight by means of the seal ring 59, and the wafer W and the contactor 60 are brought into contact with each other for electrical conduction and united as the test shell S. At this time, the sucking force can be recognized by means of the pressure gauge 28.

After the given degree of vacuum is reached in the test shell S, the first solenoid valve 26 is energized, and the second solenoid valve 27 is not. The first solenoid valve 26 is separated from the second solenoid valve 27, so that the vacuum system from the wafer chuck 50 to the first solenoid valve 26 is cut off from the atmosphere, and the second solenoid valve 27 is separated from the vacuum exhaust device side and exposed to the atmosphere. By this operation, the wafer chuck 50 is securely disconnected from the vacuum exhaust system. If the measured value of the pressure gauge 28 makes no change at this time, the necessary degree of vacuum for unification can be maintained between the wafer chuck 50 and the contactor 60, so that the wafer chuck 50, wafer W, and contactor 60 can be securely united as the test shell S. Thus, the reliability test can be securely conducted thereafter. If the measured value of the pressure gauge 28 fluctuates, however, vacuum leakage may be caused between the wafer chuck 50 and the contactor 60.

If the measured value of the pressure gauge 28 is subject to no fluctuation, however, the air cylinder 20D of the valve control mechanism 20 is actuated with the first solenoid valve 26 kept on. The first and second quick couplings 20A and 20B are disengaged from their corresponding valve mechanisms 51 and 52. If the solenoid valve 22 is de-energized, the wafer chuck 50 is disengaged from the main chuck 15 and allowed to be transported. The wafer chuck 50, wafer W, and contactor 60 that are united as the shell S are transported to a reliability tester to be tested thereby.

After the reliability test is finished, the test shell S is transported to the aligner 10, and the identification code 62 on the test shell S is read by means of the reader 41. The read information is delivered to the control device 40, the central processing unit of which analyzes the read information. Position information associated with the read identification code 62 is retrieved, and this position information is fetched from the storage section. Based on the position information, the central processing unit computes X- and Y-direction dislocations between the test shell S and the main chuck 15 according to the center position of the wafer W and the center position of the main chuck 15 reached when the test shell S is formed. The main chuck 15 is drivingly controlled according to the resulting arithmetic value. As this is done, the test shell S is mounted on the head plate 13, and the main chuck 15 is moved to the position (in the X and Y directions) for the formation of the test shell S in accordance with the aforesaid computation value. In this position, the main chuck 15 rises to join with the test shell S, whereupon the first and second valve mechanisms 51 and 52 are connected to the first and second quick couplings 20A and 20B, respectively, on the side of the main chuck 15. Thus, the valve mechanisms 51 and 52 are opened.

When the first and second valve mechanisms 51 and 52 are connected to the valve control mechanism 20, as described above, the first solenoid valve 26 of the vacuum exhaust line 21A is on, the second solenoid valve 27 is off, the solenoid valve 30 of the vacuum exhaust line 21B is also on, and the wafer W is kept on the wafer chuck 50 by vacuum suction. Thereafter, the first solenoid valve 26 is de-energized, and the solenoid valve 30 is also de-energized. The internal channel of the wafer chuck 50 is exposed to the atmosphere through the first and second solenoid valves 26 and 27 and the solenoid valve 30, whereupon the test shell S is allowed to be disassembled into the wafer chuck 50, wafer W, and contactor 60. The wafer w is returned to its original outer peripheral surface in the carrier by means of the fork in the loader chamber 11.

According to the present embodiment, as described above, the identification code 62 is attached to the contactor 60, the reader 41 is provided for reading the identification code 62, the identification code 62 read by means of the reader 41 and the position of the main chuck 15 reached when the test shell S is formed are associated with each other and loaded into the control device 40, the respective positions of the wafer W and the main chuck 15 for the formation of the test shell S are retrieved by means of the control device 40 in accordance with the identification code 62 read by means of the reader 40 when the test shell S is disassembled, and the main chuck 15 is moved according to the result of the retrieval. As the test shell S is disassembled in the aligner 10 after the reliability test, the main chuck 15 is returned to the position for the formation of the test shell, and the main chuck 15 is securely aligned with the test shell S on the head plate 13. The first and second valve mechanisms 51 and 52 of the test shell S on the main chuck 15 are connected to the valve control mechanism 20 by means of the control device 40, whereupon the test shell S can be disassembled quickly and securely.

Although the aligner 10 according to the present embodiment described above is designed so that the contactor 60 and the wafer chuck 50 are mounted manually, mounting these elements can be automated.

Optically readable information, magnetically readable information, mechanically readable information, etc. can be used as the identification code that is provided outside the wafer holder and/or the contactor in the aligner according to the present invention.

The identification code that is provided outside the wafer holder and/or the contactor may be read at any time.

According to the invention described in claims 1 and 2 of the present invention, there may be provided an aligner in which a test shell can be securely placed on a stage after the stage is securely returned to the position in which the test shell S is formed, without regard to the position in which a wafer is placed on a wafer holder, when the test shell, which is obtained by uniting a contactor, the wafer, and the wafer holder, is disassembled.

What is claimed is:

1. The aligner for forming and disassembling a test shell, comprising:
    a contactor including a plurality of contact terminals electrically in contact with a plurality of electrodes of a plurality of semiconductor devices formed on a semiconductor wafer;
    a wafer holder provided with a vacuum suction mechanism including a valve mechanism and capable of holding said contactor and said semiconductor wafer by means of a vacuum sucking force formed by said vacuum suction mechanism, thereby forming a united test shell;
    a stage for supporting said wafer holder for movement in X, Y, Z and θ directions;
    a first control device for effecting control for moving said stage in the X, Y and θ directions so that said plurality of contact terminals and said plurality of predetermined electrodes are aligned with one another and controls for moving said stage in the Z direction so that said contact terminals and said electrodes are in contact with one another;
    a valve control mechanism mounted on the stage and used to connect and disconnect said valve mechanism of said wafer holder to and from an exhaust device, said valve control mechanism serving to connect the vacuum suction mechanism of said wafer holder to the exhaust device, cause said vacuum suction mechanism to form said vacuum sucking force, and cancel said vacuum sucking force of the vacuum suction mechanism of said wafer holder, thereby disassembling said test shell to said wafer holder, said semiconductor wafer, and the contactor;
    a storage unit for storing position information on the position in which said stage is moved in the X, Y and θ directions to align said plurality of contact terminals and said plurality of electrodes with one another; and
    a second control device adapted to move said stage to said position in accordance with said position information stored in said storage unit and place said test shell on said stage in said position, thereby canceling said vacuum sucking force, as said vacuum sucking force is canceled by means of said valve mechanism to disassemble said test shell.

2. The aligner according to claim 1, wherein said test shell is a shell for one test, out of a reliability test and an electrical property test.

3. The aligner according to claim 1, which further comprises a reader for reading an identification code provided outside said wafer holder and/or said contactor, and wherein said storage unit also stores said identification code, and said second control device moves said stage to said position in accordance with said identification code and said position information.

4. The aligner according to claim 3, wherein said identification code is a bar code, and said reader is a bar code reader.

5. The aligner according to claim 3, wherein said identification code is automatically readable information.

6. The aligner according to claim 5, wherein said automatically readable information is selected among optically readable information, magnetically readable information, and mechanically readable information.

7. The aligner according to claim 1, wherein said storage unit also stores information on the distance for which said stage is raised in the Z direction to bring said plurality of predetermined electrodes of the semiconductor wafer electrically into contact with said plurality of contact terminals of said contactor.

8. A method for disassembling said test shell in the aligner according to claim 1, comprising steps of:
    moving said stage to the position for the formation of said test shell in accordance with said position information stored in said storage unit;
    placing said test shell on said moved stage;
    connecting said valve control mechanism on said stage to said valve mechanism of said wafer holder of said test shell; and
    canceling the vacuum sucking force of said vacuum suction mechanism of said test shell by means of said valve control mechanism.

9. The method for disassembling said test shell according to claim 8, which further comprises a step of reading an identification code provided outside said wafer holder and/or said contactor and loading the identification code into said storage unit, and wherein said step of moving said stage to the position for the formation of said test shell is carried out in accordance with said position information and said identification code.

10. The shell used in said aligner according to claim 3, wherein said wafer holder holding the semiconductor wafer and said contactor including a plurality of contact terminals electrically in contact with a plurality of electrodes of a plurality of semiconductor devices formed on said semiconductor wafer are united by means of the vacuum sucking force in a manner such that said plurality of contact terminals are electrically in contact with said plurality of predetermined electrodes, and a readable identification code is attached to the outer surface of said wafer holder and/or the contactor.

* * * * *